United States Patent [19]

Peters

[11] 4,447,469
[45] May 8, 1984

[54] PROCESS FOR FORMING SULFIDE LAYERS BY PHOTOCHEMICAL VAPOR DEPOSITION

[75] Inventor: John W. Peters, Malibu, Calif.

[73] Assignee: Hughes Aircraft Company, El Segundo, Calif.

[21] Appl. No.: 387,086

[22] Filed: Jun. 10, 1982

[51] Int. Cl.$^3$ .................. B05D 3/06; H01L 21/205
[52] U.S. Cl. .................. 427/54.1; 427/85; 427/87; 427/255.2; 427/255.4; 427/255; 427/82
[58] Field of Search .............. 427/54.1, 85, 87, 255.2, 427/255.4, 82, 255.1, 255; 156/DIG. 92, 613, 614

[56] References Cited

U.S. PATENT DOCUMENTS

| | | | |
|---|---|---|---|
| 3,761,308 | 9/1973 | Galli | 427/76 |
| 3,920,860 | 11/1975 | Freller et al. | 427/87 |
| 4,181,751 | 1/1980 | Hall et al. | 427/54.1 X |
| 4,265,932 | 5/1981 | Peters et al. | 427/54.1 X |
| 4,320,178 | 3/1982 | Chemla et al. | 427/82 X |
| 4,371,587 | 2/1983 | Peters | 427/255 X |

*Primary Examiner*—John D. Smith
*Assistant Examiner*—Bernard F. Plantz
*Attorney, Agent, or Firm*—Mary E. Lachman; A. W. Karambelas

[57] ABSTRACT

The specification discloses a low-temperature process for depositing a layer of a sulfide of a chosen element, such as zinc sulfide, on the surface of a substrate while simultaneously avoiding damage to the substrate. The process comprises exposing the substrate to a selected vapor phase reactant containing the chosen metal, such as dimethyl zinc, in the presence of neutral, charge-free sulfur atoms formed in a manner which avoids the generation of charged particles and high energy radiation that would damage the substrate. The sulfur atoms react with the vapor phase reactant to form the sulfide thereof, such as zinc sulfide, which deposits as a layer on the surface of the substrate. In a preferred process embodiment, the neutral sulfur atoms are generated by photochemical dissociation. In addition, there is disclosed a process for forming a native sulfide layer on the surface of a chosen substrate by exposing the substrate to neutral, charge-free sulfur atoms.

26 Claims, 1 Drawing Figure

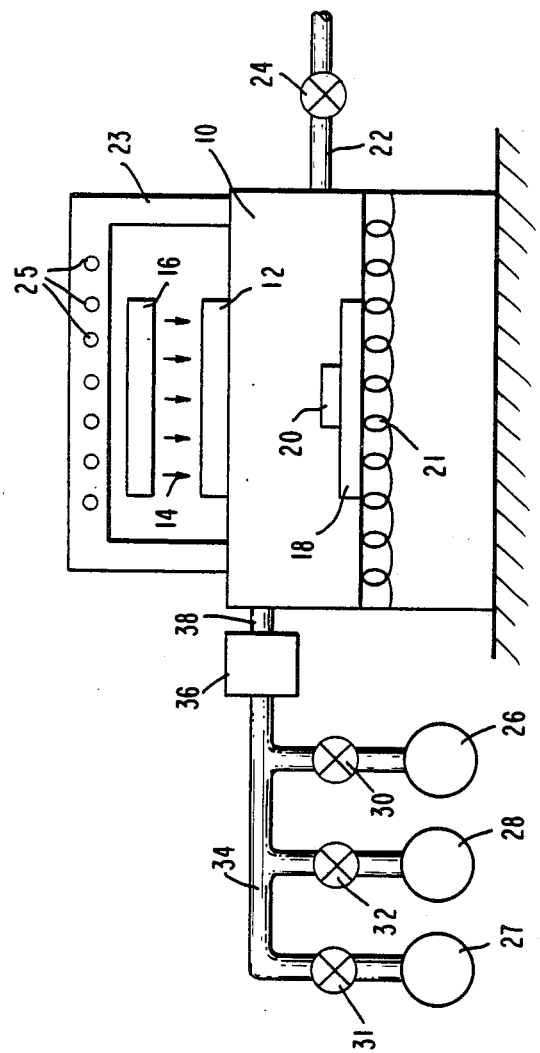

PROCESS FOR FORMING SULFIDE LAYERS BY PHOTOCHEMICAL VAPOR DEPOSITION

BACKGROUND OF THE INVENTION

1. Field of the Invention

This invention relates generally to the fabrication of semiconductor devices and circuits in which a sulfide layer is formed on the surface of a selected substrate and, more particularly, to the deposition of a sulfide layer or the formation of a native sulfide layer on a substrate at a low temperature and without causing charge damage or radiation damage to the substrate.

2. Description of the Prior Art

In the manufacture of semiconductor devices and circuits, it is often necessary to form an insulator or dielectric layer on the surface of a semiconductor substrate to provide electrical insulation between adjacent layers or structures. The physical and electrical properties of the dielectric layer are important in determining the electrical performance of the completed device or circuit. Frequently used dielectric materials include silicon dioxide, glasses of silicon dioxide and other oxides, silicon nitride, aluminum oxide, and organic films, such as polyimide or Teflon, as discussed, for example, by J. A. Amick, G. L. Schnable, and J. L. Vossen, in the publication entitled "Deposition techniques for dielectric films on semiconductor devices", in the *Journal of Vacuum Science and Technology*, Vol. 14, No. 5, Sept./Oct. 1977, at page 1053. In addition to these latter materials, sulfides have more recently been used to provide thin film passivation layers which are transmissive to radiation in the infrared range, for use in such devices as infrared radiation detectors.

The conventional methods for forming sulfide thin films involve either sputtering or evaporation processes. In accordance with a known non-reactive sputtering process, as described, for example, by B. R. Critchley and P. R. C. Stevens, in the *Journal of Physics D, Applied Physics*, Vol. 11, 1978, pages 491 to 498, a disk of a selected sulfide material, such as zinc sulfide (ZnS), is bombarded in a reaction chamber with inert ions such as argon ions. The bombarding inert ions cause the ZnS to vaporize from the target (disk), and the vaporized ZnS subsequently deposits on the selected substrate. In such a sputtering process, the bombarding ions are formed by subjecting the chosen bombarding material, such as argon, to a radio frequency (rf) or direct current (dc) discharge. However, as a result of the exposure of the chosen bombarding material to the discharge, numerous extraneous ionized and neutral particles and high energy radiation with wavelengths as low as 500 angstroms or lower are produced. These extraneous particles then bombard the surface of the substrate on which the sulfide is being formed and cause damage thereto by altering the quantity and distribution of charge therein. In addition, the bombardment of the substrate surface by these particles causes the formation of additional charged particles and radiation, which may also damage the substrate. This alteration in the charge of the substrate undesirably alters the electrical performance of the substrate and any structures formed therein. In addition, the deposited sulfide may incorporate charges or dangling bonds, which create high surface state densities at the interface between the semiconductor substrate and the deposited sulfide, and which will trap charges when a voltage is applied to the device, thereby preventing optimum device performance. The damage produced by charge bombardment and radiation bombardment is particularly noticeable when the substrate comprises an electrically sensitive device, such as a charge coupled device or a device formed of certain compound semiconductor materials, such as mercury cadmium telluride, indium antimonide, or gallium arsenide.

In accordance with a known evaporation process to form a thin sulfide layer, as described, for example, by K. Pulker and J. Mäser, in *Thin Solid Films*, Vol. 59, 1979, pages 65 to 76, a source comprising the selected sulfide, such as arsenic sulfide, is placed in a reaction chamber and is raised to an elevated temperature sufficient to cause evaporation of the sulfide, which subsequently deposits on the selected substrate. However, the sulfide films formed by evaporation processes generally have non-uniform surface morphology and non-reproducible deviations from stoichiometric composition, which degrade the electrical performance and reliability of the device on which the sulfide layer is formed.

It is the alleviation of the prior art problem of imparting damage to sensitive devices due to charge bombardment and radiation bombardment during the formation of a good quality sulfide layer thereon to which the present invention is directed.

SUMMARY OF THE INVENTION

The general purpose of this invention is to provide a new and improved process for depositing a layer of a sulfide of a chosen element on the surface of a selected substrate while simultaneously avoiding substrate damage due to charged particles or broadband electromagnetic radiation. This process possesses most, if not all, of the advantages of the above prior art sulfide deposition processes, while overcoming their above-mentioned significant disadvantages.

The above general purpose of this invention is accomplished by exposing the substrate to a selected vapor phase reactant in the presence of neutral, charge-free sulfur atoms. The sulfur atoms react with the vapor phase reactant to form the desired sulfide, which deposits as a layer on the substrate. The use of neutral, charge-free sulfur atoms avoids damage to the substrate due to charge bombardment or radiation bombardment.

Accordingly, it is a further purpose of the present invention to provide a new and improved process for forming a layer of a sulfide of a chosen element on the surface of a selected substrate, wherein the sulfide layer has good insulating properties.

Another purpose of the present invention is to provide a process of the type described which minimizes the value of the surface state density at the sulfide/semiconductor substrate interface and thus minimizes the charge traps in the deposited sulfide layer.

Still another purpose is to provide a process of the type described which produces a low density of generation/recombination centers at the interface between the deposited sulfide layer and the substrate, and thus provides good minority carrier lifetime in the substrate and reduced susceptibility to radiation damage in the device formed by this process.

Another purpose is to provide a process of the type described in which the radiation hardness of the substrate can be maintained during deposition of the sulfide layer thereon.

Yet another purpose is to provide a process of the type described for forming a layer of a sulfide material having desirable optically antireflective properties.

A further purpose is to provide a process of the type described in which the temperature is sufficiently low so as to avoid thermal damage to a temperature-sensitive substrate.

Another purpose is to provide a process of the type described which is performed at a temperature as low as room temperature (e.g., 30° C.) and thus eliminates the problems of boundary migration and the resulting decreased device yields.

Yet another purpose of the present invention is to provide a process of the type described which produces dense, non-granular, adherent sulfide films of stoichiometric composition on selected substrates.

Another purpose is to provide a process of the type described which produces a high quality sulfide material reproducibly and with high yield.

It is a further purpose of the present invention to provide a new and improved process for forming a layer of a native sulfide on the surface of a selected substrate.

Another purpose of the present invention is to provide a new and improved process for depositing a layer of a chosen sulfide containing a selected dopant material on the surface of a substrate while avoiding damage to the substrate due to charge bombardment or radiation bombardment.

A feature of the present invention is that a low-temperature photochemical vapor deposition process may be used to form the above-described deposited sulfide layer or native sulfide layer.

The foregoing and other advantages and features of the present invention will become more readily apparent from the following more particular description of the preferred embodiments of the invention, as illustrated in the accompanying drawing.

BRIEF DESCRIPTION OF THE DRAWING

The FIGURE illustrates, in schematic form, a preferred apparatus which may be adapted for carrying out the processes according to various embodiments of the present invention, in which neutral sulfur atoms are formed by either the mercury photosensitized dissociation or the direct dissociation of a sulfur-containing precursor, and are reacted to form either an undoped or a doped sulfide layer.

DETAILED DESCRIPTION OF THE INVENTION

The FIGURE shows, in simplified form, an apparatus suitable for implementation of two process embodiments of the present invention in which neutral sulfur atoms are formed by the mercury photosensitized dissociation of a chemically unreactive sulfur-containing precursor, such as carbonyl sulfide, hydrogen sulfide, dimethyl sulfide, carbon disulfide, and methyl mercaptan. (The term "chemically unreactive" is used herein to denote that a substance will not react with the designated reactants under normal mixture conditions.) A reaction chamber 10, in which the chemical vapor deposition reaction occurs, is provided with a quartz window 12, which is integral with the top surface of the reaction chamber 10. The quartz window 12 is transmissive to the selected wavelength of radiation used to initiate the desired photochemical reaction to be discussed below. This radiation 14 of a selected wavelength is produced by the radiation-producing means 16, which may be, for example, an array of low pressure mercury vapor arc lamps. Within the reaction chamber 10, there is a substrate holder 18, which receives a substrate 20 onto which the desired sulfide layer is to be deposited. The substrate 20 may be a semiconductor material having electronic structures, such as regions of predetermined conductivity, formed therein. In addition, the substrate 20 may comprise a semiconductor material having a layer of a second material, such as a native sulfide, formed on the surface thereof, such that the sulfide layer of the present invention is deposited on the surface of this second material. Alternatively, the substrate 20 may comprise an electrooptical component or element, such as a lens or mirror, or a body of a chosen material, such as a plastic material, on which the sulfide is deposited.

External to the reaction chamber 10 and adjacent to the bottom surface thereof, there are heating elements 21, which may be formed, for example, of Nichrome wire and are activated by applying a controlled voltage thereto. The heating elements 21 may be used optionally to heat the substrate 20 to the required temperature so that appropriate properties of the deposited layer, such as density, may be obtained. The temperature in the chamber 10 may be maintained as low as room temperature (e.g., 30° C.) or as high as required (e.g., 300° C. or higher). However, since mercury vapor arc lamps, for example, become less efficient at increased temperatures, it is necessary to provide external water cooling or an external air or nitrogen cooling source to cool these lamps and remove radiant heat produced by the substrate and substrate holder 18 at certain elevated temperatures. For this purpose, the radiation-producing means 16 is completely contained within the enclosure 23, which may be formed of aluminum, and an external cooling means 25, such as pipes with water flowing therethrough as shown in the FIGURE or flowing nitrogen gas, is activated to apply cooling to the enclosure 23. The enclosure 23 is secured to the outside surface of the reaction chamber 10 which surrounds the quartz window 12, but may be removed therefrom as required. Thus, the processing temperature is maintained at a level such that sufficient cooling of the mercury lamps can be accomplished in order to provide efficient lamp performance. The enclosure 23 also provides eye protection to the operator from the radiation 14. Leading from the reaction chamber 10, there is a tube 22 which passes through a valve 24 and then to a vacuum-producing means, such as a pump (not shown), which is used to evacuate the chamber 10 to a sufficiently low pressure to allow the vapor deposition reaction to occur.

External to the reaction chamber 10, there are the chambers 26 and 28 which contain the individual reactant gases for the selected chemical vapor deposition reaction, for example, dimethyl zinc and carbonyl sulfide. The chambers 26 and 28 are connected to the control valves or flowmeters 30 and 32, respectively, which are used to control the amounts of reactants which are introduced into a tube 34. Alternatively, for second and fourth process embodiments of the present invention (discussed below), there are included a third chamber 27, which contains the precursor of the selected dopant material, such as trimethyl indium, and a corresponding control valve or flowmeter 31, which controls the amount of dopant precursor introduced from the chamber 27 into the tube 34, where it is mixed with the other reactant gases discussed above. In addition, there may be included a fourth chamber and associated control valve (not shown) for containing an inert carrier gas, such as nitrogen. The carrier gas is introduced into the chamber, such as chamber 26, containing the selected vapor phase reactant, such as dimethyl zinc, which has a low vapor pressure, and serves to carry the vapor phase reactant out of the chamber 26. In order to simplify the FIGURE herein, the carrier gas mechanism is not shown since the use of carrier gas is well known in the art.

The reactant gases flow through the tube 34 into a chamber 36 which contains a pool of mercury (at room temperature) having mercury vapor above it, at a vapor pressure of $10^{-3}$ Torr at 30° C. The reactant gases thus become mixed with mercury vapor in the chamber 36 and this reactant gas mixture then passes through a tube 38 and into the reaction chamber 10, where the chemical vapor deposition reaction may be brought about. The components of the apparatus shown in the FIGURE may be constructed of stainless steel or aluminum, unless otherwise specified. The apparatus shown in the FIGURE may be used for either a low pressure continuous flow photochemical reactor system, in which there is a continuous influx of reactant gases and removal of reaction by-products during the photochemical reaction process, or for a static photochemical reactor system, in which specified amounts of reactants are introduced into the reaction chamber, the flow of reactant gases is stopped, and then the photochemical reaction process is allowed to occur.

In practicing the present invention in accordance with the first embodiment thereof, which depends on the mercury-sensitized photochemical generation of atomic sulfur, and using the apparatus of the FIGURE with only two reactant gas chambers (e.g., the chambers 26 and 28), a chemical vapor deposition process is performed as generally described by Werner Kern and Richard S. Rosler in the publication entitled, "Advances in Deposition Processes for Passivation Films", in the *Journal of Vacuum Science and Technology*, Vol 14, No. 5, Sept.-Oct. 1977, pages 1082 to 1099, in the discussion of low pressure chemical vapor deposition processes, and further discussed in the book entitled "Photochemistry" by J. G. Calvert and J. N. Pitts, Jr., John Wiley and Sons, Inc. New York, 1966, both references being incorporated herein by reference. The reaction chamber 10 is evacuated by the vacuum-producing means to a predetermined pressure, for example 1 to 4 torr (millimeters of mercury). (This operating pressure is selected to maximize the mean free path and lifetime of the reactants in order to produce a sulfide with good morphology and good step coverage, while at the same time producing practical deposition rates.) The selected vapor phase reactant, such as dimethyl zinc [$Zn(CH_3)_2$], is placed in a chamber such as the chamber 26, and a chemically unreactive sulfur-containing precursor, such as carbonyl sulfide (COS), is placed in a chamber such as the chamber 28. The valves 30 and 32 are set so that the reactants from the chambers 26 and 28, respectively, in a predetermined ratio and at a predetermined flow rate may pass into the tube 34 and then into the chamber 36, which contains a pool of mercury. These reactant gases become mixed with mercury vapor in the chamber 36 and pass from the chamber 36 through the tube 38 into the reaction chamber 10, which is maintained at approximately room temperature (e.g., 30° C.) or up to 200° C. or higher. The reaction temperature is chosen to maximize the quality of the deposited sulfide, while at the same time minimizing thermal damage to the substrate, as discussed in further detail below. The radiation-producing means 16 is activated and produces the radiation of a selected wavelength required to produce the desired photochemical reaction (e.g., 2537 Å which is the resonance absorption line to produce mercury in an excited state). The radiation 14 passes through the quartz window 12 into the reaction chamber 10, where it excites the mercury (Hg) atoms in the reactant gas mixture to form mercury atoms in an excited state (Hg*), which is approximately 5 electron volts above normal ground state, but non-ionized, as shown in Equation (1) below. The Hg* then collides with the sulfur-containing precursor, such as COS, transferring energy thereto and causes the precursor to dissociate and produce atomic sulfur (S), as shown in Equation (2a) below. In addition, the Hg* may react with the selected vapor phase reactant, such as $Zn(CH_3)_2$ to produce a charge-free reactive radical, such as a methyl zinc radical, as shown in Equation (2b) below.

Finally, the atomic sulfur reacts with the reactant, $Zn(CH_3)_2$ or the reactive radical thereof, to produce the desired sulfide, such as zinc sulfide (ZnS) as shown in Equations (3a) and (3b) below. The reactant gas ratio is controlled in order to control the stoichiometric composition of the sulphide product, as discussed in further detail in Example 1. The by-products of the reactions of Equations (3a) and (3b) comprise hydrocarbon volatiles, such as ethane, dimethyl sulfide, and higher alkanes.

$$Hg + h\nu(2537 \text{ Å}) \rightarrow Hg^* \tag{1}$$

where
h = Planck's constant
$\nu$ = frequency of absorbed radiation $$Hg^* + COS \rightarrow S + CO + Hg \tag{2a}$$

$$Zn(CH_3)_2 + Hg^* \rightarrow \cdot Zn(CH_3) + \cdot CH_3 + Hg \tag{2b}$$

$$Zn(CH_3)_2 + S \rightarrow ZnS + \text{By-products} \tag{3a}$$

$$\cdot Zn(CH_3) + S \rightarrow ZnS + \text{By-products} \tag{3b}$$

The reaction of Hg* with $Zn(CH_3)_2$ to form the radicals thereof as shown in Equation (2b) is a side reaction which is not necessary to the process of the present invention, but leads to the same end product as the major reaction path shown in Equations (1), (2a), and (3a). As indicated previously, the atomic sulfur produced in Equation (2a) above may react directly with the selected vapor phase reactant as described in Equation (3a) above, without first forming an intermediate radical.

Alternatively, the atomic sulfur required for this first process embodiment of the present invention may be formed by the mercury-sensitized dissociation of other compounds containing sulfur, such as hydrogen sulfide ($H_2S$), dimethyl sulfide [$S(CH_3)_2$] or other dialkyl sulfides, carbon disulfide ($CS_2$), methyl mercaptan [$HS(CH_3)$] and other photo-dissociable sulfur-containing compounds having sufficient vapor pressure to go into the gas phase (e.g. having a vapor pressure of 1 to 3 torr at room temperature). It is noted that upon photodissociation of some of the above-noted sulfur-containing compounds, there may also be produced a certain amount of sulfur-containing molecular fragments, rather than atomic sulfur. While such sulfur-containing molecular fragments may contribute to the formation of a sulfide layer, the quality of the sulfide layer so produced may be less desirable than the sulfide layer formed from atomic sulfur. The preferred process embodiment of the present invention comprises the formation of discrete atomic sulfur which reacts with the vapor phase reactant in a controllable manner and without undesired side reactions.

The selected vapor phase reactant used in the process of the present invention comprises a volatile compound containing the metal or cation whose sulfide is being formed and which is capable of reaction which sulfur atoms as described herein. Some suitable metal-containing containing vapor phase reactants are a methyl compound or other alkyl or alkoxy compound, a chloride compound or other halide compound, or a hydrogen compound. For example, zinc sulfide is deposited by the process of the present invention using a dimethyl zinc reactant, as previously discussed, or a zinc chloride ($ZnCl_2$) reactant. Lead sulfide (PbS) is deposited using a tetramethyl lead [$Pb(CH_3)_4$] reactant; arsenic trisulfide ($As_2S_3$) is deposited using an arsine ($AsH_3$) reactant; indium trisulfide ($In_2S_3$) is deposited using a trimethyl indium [$In(CH_3)_3$)] reactant; and cadmium sulfide is deposited using a dimethyl cadmium [$Cd(CH_3)_2$] reactant.

By the above-described process of the present invention, sulfur atoms are produced by a photochemical dissociation process which generates only neutral, charge-free particles. The term "sulfur atom" or "atomic sulfur" is used herein to designate a sulfur atom which is a neutral species having unbonded electrons in its outer electron shell. The presence of these unbonded electrons causes the sulfur atom to be highly reactive, to try to gain two more electrons and form a stable, completed outer electron shell. In addition to being neutral (non-ionized) and charge-free, the atomic sulfur used in the present invention is formed in a benign manner which avoids the generation of charged particles or high energy radiation that may damage the substrate or the interface between the substrate and the deposited sulfide. Thus, the process of the present invention is charge-free since it is an electrically neutral process which generates no positive or negative particles or ions, or free electrons. Consequently, the process of the present invention avoids the previously discussed prior art problem of substrate damage due to bombardment by charged particles or high energy radiation. It is intended to include within the scope of the present invention not only photochemically generated neutral atomic sulfur but also any neutral, charge-free sulfur atoms formed in a manner which avoids the generation of charged particles or high energy radiation.

More specifically, by the process of the present invention, it is anticipated that the value of the surface state density at the sulfide/semiconductor substrate interface and the charge traps in the sulfide or insulator layer will be minimized. In addition, a low density of generation/recombination centers (i.e., dangling bonds or traps) is expected at the interface between the deposited sulfide and the substrate, and thus good minority carrier lifetime in the substrate is expected in devices formed by the process of the present invention.

The problem of substrate damage due to charge-bombardment or radiation-bombardment is particularly important when processing radiation-hardened devices (i.e. devices which are required to be resistant to damage by gamma radiation, such as for use in space applications). When certain solid materials are subjected to gamma radiation, electrons are ejected from their normal position and become trapped in the various structural defects of the crystal lattice or network of the material. This latter effect alters the electrical properties of the material such that device performance is degraded. By the very nature of some prior art processes for sulfide deposition previously discussed, dangling bonds or charge traps are created in the substrate or at the interface between the deposited sulfide and the substrate due to charge-bombardment or radiation-bombardment of the substrate. These dangling bonds or traps normally increase the probability of radiation damage to the device since they provide sites for entrapment of charged species. As discussed above, the process of the present invention is charge-free and the formation of charge traps in the sulfide or at the sulfide/substrate interface is minimized. Consequently, the process of the present invention is capable of maintaining the radiation-hardness of a device during sulfide deposition. Moreover, it is known that at increased temperatures, structural defects are more likely to be produced in a device being processed, which, in turn, would increase the susceptibility of the device to radiation damage. The process of the present invention overcomes this latter problem by using a low processing temperature, such as 30° to 300° C. Thus, the process of the present invention maintains the radiation hardness of a given device both because of the charge-free nature of the process and because of the low processing temperature. In addition, because of the low processing temperature of the present invention, this process is especially well suited for forming a sulfide layer on a temperature-sensitive compound semiconductor material (such as mercury cadmium telluride, indium antimonide, or gallium arsenide) or on a temperature-sensitive plastic material (such as a polycarbonate, an acrylic, or a polyimide).

Moreover, the problem of boundary migration has been eliminated since the process of the present invention can be conducted at a relatively low temperature, i.e. as low as room temperature; and the associated problem of decreased device yield encountered in the high temperature fabrication of certain semiconductor devices has been avoided.

Further, the process of the present invention is highly reproducible, reliable, and capable of a high degree of control over the sulfide growth process by, among other things, controlling the initiating radiation for the photochemical reaction. Finally, the sulfide layer formed by the process of the present invention has excellent stoichiometry, morphological characteristics and infrared transmission characteristics, and is dense, non-granular, durable, and strongly adherent to a variety of substrate surfaces, as discussed in detail in Example 1 herein.

The sulfide layers formed by the process of the present invention are useful as a passivation layer or as an antireflective coating which is transparent to radiation in the infrared range, particularly on temperature-sensitive substrates. More specifically, a zinc sulfide film formed in accordance with the present invention is a dielectric material which is useful for providing passivation of devices formed from compound semiconductor materials, such as gallium arsenide and mercury cadmium telluride. Arsenic trisulfide is useful for the passivation of lead sulfide infrared detectors. Lead sulfide, which is a semiconductor material, is useful as the active element in infrared detectors and infrared charge-coupled devices. Moreover, the sulfides of the present invention may be applied to the surface of an optical element or component (such as a glass or plastic lens or mirror) as an antireflective or enhanced reflective coating. For such applications as discussed above, the sulfide is usually provided as a thin layer (e.g., 0.1 to 10 micrometers).

In addition, the sulfide layers formed by the process of the present invention may be provided as a patterned layer. In such a case, the sulfide material may be deposited as a continuous layer and subsequently preferentially etched in a predetermined pattern using photolithographic procedures which are known in the art. Alternatively, the sulfide material may be deposited in a predetermined pattern using a mask at the substrate surface or by using focused initiating radiation which strikes only selected portions of the substrate, as described in U.S. Pat. No. 4,226,932, assigned to the present assignee.

Furthermore, in accordance with a second process embodiment of the present invention, there may be deposited a sulfide layer comprising a sulfide material, such as zinc sulfide, having a chosen dopant, such as tin, incorporated therein to modulate the refractive index of the host sulfide material as may be required for a particular optical application. This second process embodiment of the present invention may be performed by practicing the present invention as described above, using the apparatus of the FIGURE with three reactant gas chambers (e.g., the chambers 26, 27, and 28). The selected vapor phase reactant, such as $Zn(CH_3)_2$, is exposed to simultaneously formed and photochemically generated neutral sulfur atoms and neutral atoms or molecular fragments of the selected dopant, such as tin-containing radicals. The neutral reactant particles are produced by the mercury photosensitized dissociation of a chemically unreactive sulfur-containing precursor, such as carbonyl sulfide (COS) and a chemically unreactive dopant-containing precursor, such as tetramethyl tin $[Sn(CH_3)_4]$, which results in the generation of atomic sulfur and neutral trimethyl tin radicals, respectively, as shown in Equations (4) through (6) below. The atomic sulfur and trimethyl tin radicals subsequently react with the $Zn(CH_3)_2$ to form tin-doped zinc sulfide (Sn:ZnS) as shown in Equation (7) below. The by-products noted in Equation (7) comprise hydrocarbon volatiles, as previously discussed.

$$Hg + h\nu(2537 \text{ Å}) \rightarrow Hg^* \qquad (4)$$

$$Hg^* + COS \rightarrow S + CO + Hg \qquad (5)$$

$$Hg^* + Sn(CH_3)_4 \rightarrow Sn(CH_3)_3 + \cdot CH_3 + Hg \qquad (6)$$

$$Zn(CH_3)_2 + \cdot Sn(CH_3)_3 + S \rightarrow Sn{:}ZnS + \text{By-products} \qquad (7)$$

A mechanistic alternative to the sequence described above involves the simultaneous reaction of both $Zn(CH_3)_2$ and $Sn(CH_3)_4$ with atomic sulfur, as indicated in Equations (8) through (10) below. Thus, atomic sulfur alone may be sufficient to bring about the desired reaction as shown in Equation (10) below. Consequently, the production of neutral particles of the selected dopant material as described above in Equation (6) may not be necessary in practicing the second process embodiment of this invention, but may occur.

$$Hg + h\nu(2537 \text{ Å}) \rightarrow Hg^* \qquad (8)$$

$$Hg^* + COS \rightarrow S + CO + Hg \qquad (9)$$

$$Zn(CH_3)_2 + Sn(CH_3)_4 + S \rightarrow Sn{:}ZnS + \text{By-products.} \qquad (10)$$

The procedure followed to accomplish this second process embodiment of the invention is essentially as described above with respect to the first process embodiment of the present invention, except that additionally, a controlled amount of a selected dopant-containing precursor is introduced from a chamber such as the chamber 27 through the control valve 31 into the tube 34, where it mixes with the reactant gases from the chambers 26 and 28.

Thus, by this second process embodiment of the present invention, a doped sulfide film may be deposited by a low-temperature process which avoids the generation of charged particles and high energy radiation and their bombardment damage to the substrate. Additionally, this second process embodiment has all the advantages enumerated above with respect to the formation of an undoped sulfide layer by the first process embodiment of the present invention.

In accordance with this second process embodiment of the present invention, other dopants besides tin may be incorporated in the deposited sulfide layer by addition of the corresponding dopant-containing precursor to the reactant gas mixture. For example, trimethyl indium $[In(CH_3)_3]$ may be used for indium doping, diborane $(B_2H_6)$ may be used for boron doping, arsine $(AsH_3)$ may be used for arsenic doping, phosphine $(PH_3)$ may be used for phosphorus doping, hydrogen selenide $(H_2Se)$ may be used for selenium doping, or hydrogen telluride $(H_2Te)$ may be used for tellurium doping. Other dopant-containing precursors which are capable of the mercury photosensitized dissociation reaction of the type discussed herein may also be used. In addition, other sulfide materials besides ZnS, which have been discussed with respect to the first process embodiment of the present invention, may be formed as a doped sulfide as described herein. For example, indium-doped arsenic trisulfide may be formed in accordance with the present invention using trimethyl indium and trimethyl arsenic in predetermined ratios as the chosen reactants.

In accordance with the third process embodiment of the present invention, the required neutral sulfur atoms are formed by a direct photochemical dissociation reaction of a sulfur-containing precursor, thus eliminating the need for mercury photosensitization. The apparatus shown in the figure is used except that the chamber 36 which holds the mercury is omitted and only two reactant gas chambers (e.g. chamber 26 and 28) are used.

In practicing the present invention in accordance with the third process embodiment thereof and using the apparatus shown in the FIGURE, omitting the chamber 36 and using only the chambers 26 and 28, the general process described in relation to the first process embodiment of the present invention is followed, except that no mercury is used for photosensitization. The valves 30 and 32 are set so that the reactant gases, such as $Zn(CH_3)_2$ and COS, from the chambers 26 and 28, respectively, pass in a predetermined ratio and at a predetermined flow rate into the tube 34 and then into the reaction chamber 10. The radiation-producing means 16 is activated and produces the radiation 14 of a selected wavelength, which is the appropriate wavelength to cause the direct dissociation of the selected sulfur-containing precursor (e.g., 1750-1950 Å for COS). The radiation 14 passes through the window 12, which is formed of a material that is transparent to the wavelength of the radiation 14. The radiation 14 passes into the reaction chamber 10, where it causes the dissociation of the selected sulfur-containing precursor, such as COS, into atomic sulfur, which then reacts with the selected vapor phase reactant, such as $Zn(CH_3)_2$, to form the desired sulfide, such as ZnS, as shown in Equations (11) and (12) below. The by-products noted in Equation (12) comprise hydrocarbon volatiles, as previously discussed.

$$COS + h\nu(1849 \text{ Å}) \rightarrow S + CO \quad (11)$$

$$Zn(CH_3)_2 + S \rightarrow ZnS + \text{By-products} \quad (12)$$

Alternatively, the atomic sulfur required for this third process embodiment of the present invention may be formed by the direct photochemical dissociation of such compounds as hydrogen sulfide, dimethyl sulfide, carbon disulfide, methyl mercaptan or of similar materials which are capable of direct dissociation in the gas phase to produce atomic sulfur by a photochemical process as described herein. As previously discussed with regard to the first process embodiment of the present invention, some sulfur-containing molecular fragments may be produced by direct photo-dissociation of the above-noted compounds and may contribute to the formation of the sulfide layer. However, the preferred embodiment of the present invention comprises the formation of discrete atomic sulfur which reacts with the vapor phase reactant to form the desired sulfide.

By the above-described process in accordance with this third embodiment of the present invention, sulfur atoms are generated by a photochemical dissociation process which produces only neutral particles. Thus, the previously discussed prior art problems caused by the generation of charged particles and high energy radiation and their bombardment of the substrate have been avoided. The advantages of this third process embodiment of the present invention are the same as those discussed in relation to the first process embodiment previously described. In addition, the process according to this third embodiment has the advantage that no photosensitizing mercury is necessary, and thus possible mercury contamination of the deposited sulfide can be avoided. Further, the apparatus for carrying out the process according to this third embodiment is less complex than an apparatus requiring the use of mercury.

Using this third process embodiment of the present invention, there may be deposited a layer of any of the sulfide materials discussed above with respect to the first process embodiment of this invention, using the appropriate selected vapor phase reactant.

Furthermore, in accordance with a fourth process embodiment of the present invention, there may be deposited on a chosen substrate a sulfide layer which incorporates a selected dopant material by a process which uses the direct photochemical generation of atomic sulfur. The apparatus shown in the FIGURE is used except that the chamber 36 holding the mercury is omitted. The process described above with respect to the third embodiment of this invention is followed except that three reactant gas chambers (e.g., chambers 26, 27, and 28) are used, as described with respect to the second process embodiment of the present invention. To accomplish this fourth process embodiment of the present invention, the selected vapor phase reactant, such as $Zn(CH_3)_2$ is exposed to photochemically generated neutral sulfur atoms in the presence of a dopant-containing precursor, such as tetramethyl tin $[Sn(CH_3)_4]$. The neutral atomic sulfur is produced by direct dissociation of a sulfur-containing precursor, such as COS, by radiation of a selected wavelength as shown in Equation (13) below. The atomic sulfur then simultaneously reacts with the $Zn(CH_3)_2$ and the dopant $Sn(CH_3)_4$ to form the desired tin-doped zinc sulfide, as shown in Equation (14) below. The by-products noted in Equation (14) are hydrocarbon volatiles.

$$COS + h\nu(1849 \text{ Å}) \rightarrow S + CO \quad (13)$$

$$Zn(CH_3)_2 + Sn(CH_3)_4 + S \rightarrow Sn:ZnS + \text{By-products.} \quad (14)$$

A possible alternative to the above-described sequence involves the direct dissociation of the dopant containing precursor, such as tetramethyl tin, to form a neutral trimethyl tin radical as shown in Equation (15) below. The trimethyl tin radical so formed and the atomic sulfur formed in accordance with the direct dissociation reaction of Equation (13) above then react with the $Zn(CH_3)_2$ reactant to form the desired tin-doped zinc sulfide as shown in Equation (16) below.

$$Sn(CH_3)_4 + h\nu(1849 \text{ Å}) \rightarrow Sn(CH_3)_3 + \cdot CH_3$$

$$Zn(CH_3)_2 + \cdot Sn(CH_3)_3 + S \rightarrow Sn:ZnS + \text{By-products}$$

The procedure followed to accomplish the process according to the fourth embodiment of this invention is essentially as described above with respect to the third process embodiment of the present invention, except that additionally a controlled amount of a selected dopant-containing precursor, such as tetramethyl tin gas, is introduced from the chamber 27 and through the valve 31 into the tube 34, where it mixes with the reactant gases from the chambers 26 and 28.

Thus, by this fourth process embodiment of the present invention, a doped sulfide film may be deposited by a low-temperature process which avoids the generation of charged particles and high energy radiation and their bombardment damage to the substrate, and additionally avoids the use of mercury for photosensitization. The significance of these advantages has been discussed above with respect to the third process embodiment of the present invention. Various dopant materials other than tetramethyl tin may be used and various other sulfide materials may be deposited as discussed above with respect to the second process embodiment of the present invention.

Finally, by a process in accordance with a fifth embodiment of the present invention, a native sulfide layer may be formed on the surface of a selected substrate. The term "native sulfide" is used herein to designate a sulfide generated by the conversion of the top surface of the substrate (approximately 10 to 100 angstroms) to the corresponding sulfide. This fifth process embodiment may be performed by practicing the present invention as described above in relation to the third process embodiment, omitting the vapor phase reactant. More specifically, the apparatus shown in the FIGURE is used, with the omission of the chamber 36 and the chambers 27 and 28. The reaction chamber 10, which contains the selected substrate 20, is evacuated by the vacuum-producing means (not shown) to a predetermined pressure, for example, 1 to 4 torr (mm. of mercury). The selected sulfur-containing molecular precursor is placed in the chamber 25 and the valve 30 is set so that the precursor may flow from the reactant chamber 26 and then into the reaction chamber 10. The reaction chamber 10 may be maintained at approximately room temperature (e.g., 30° C.) or at higher temperatures (e.g., 200° C.). The radiation-producing means 16 is activated to produce the radiation 14 of a selected wavelength required to produce the desired photochemical reaction (e.g., 1849 Å for carbonyl sulfide). The radiation 14 passes into the reaction chamber 10, where it causes the direct dissociation of the selected sulfur-containing precursor, such as COS, into atomic sulfur, which then reacts with the surface of the substrate 20 of a selected semiconductor material to form the native sulfide thereof.

The atomic sulfur required for the process of the present invention may be formed from the selected sulfur-containing precursor by the discrete absorption of photonic energy, as previously discussed in relation to Equation (11), for example. The atomic sulfur so formed then reacts with the surface atoms of the substrate, such as mercury cadmium telluride (HgCdTe), to form the native sulfide thereof comprising (mercury cadmium) sulfide and tellurium sulfide, in accordance with Equation (17) below.

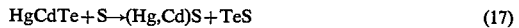

$$HgCdTe + S \rightarrow (Hg,Cd)S + TeS \qquad (17)$$

Alternatively, the atomic sulfur required in this fifth process embodiment of the present invention may be generated by the mercury sensitized photochemical dissociation of a selected sulfur-containing precursor, such as carbonyl sulfide, as discussed herein in relation to Equations (1) and (2) and the first process embodiment of the present invention. However, it is anticipated that in this alternative process embodiment, mercury sulfide (HgS) will be deposited during the native sulfide formation and may cause contamination of the latter.

By the above-described fifth process embodiment of the present invention, sulfur atoms are produced by a photochemical process which generates only neutral particles. Thus, the prior art problem associated with the generation of charged particles and high energy radiation which cause damage to the substrate as previously discussed herein has been eliminated. The incorporation of fixed or mobile charges in the native sulfide layer formed is minimized by the process of the present invention. In addition, an insulating layer may be formed on the surface of the native sulfide layer to provide, for example, a semiconductor device. Such a native sulfide layer enhances the interface properties between the insulating layer and the substrate. Moreover, by the above-described process for forming a native sulfide layer, there is also achieved minimization of the value of the surface state density at the interface of the semiconductor substrate with the native sulfide and an insulating layer formed thereon. This combination of the native sulfide layer and the overlying insulating layer is referred to herein as the "native sulfide/insulator composite." Because of the above-described effects, the device performance in enhanced by forming a native sulfide layer in accordance with the present invention. Moreover, the above-described fifth process embodiment of the present invention can be performed at a low temperature (e.g., 30° to 200° C.) so that thermal damage to the substrate is avoided, as previously discussed.

Using the above-described process, the present invention may be used to form the native sulfide of any semiconductor material which is known to form a native sulfide. The process of the present invention is particularly useful for forming the native sulfides of compound semiconductor materials whose constituent elements are known to form the corresponding sulfide compounds. Such compound semiconductor materials include: mercury cadmium telluride (HgCdTe), gallium aluminum arsenide (GaAlAs), indium gallium arsenide (InGaAs), indium antimonide (InSb), gallium arsenide (GaAs), and gallium antimonide (GaSb). In addition, the process of the present invention may be used to form the native sulfide of certain elemental semiconductor materials, such as germanium.

Further, prior to the formation of the native sulfide in accordance with the process of the present invention, it may be advantageous to use a cleaning process, such as a wet chemical etching process as is known in the art, to provide a clean substrate surface for the formation of the native sulfide layer.

After the native sulfide layer has been formed by the process of the present invention, a chosen dielectric passivation layer may be formed thereon to provide a device having enhanced semiconductor/insulator interface properties as described above. Optionally, the substrate may have regions of predetermined conductivity defined therein. The process according to this fifth embodiment of the present invention is particularly useful when followed by one of the alternative process embodiments described herein for depositing a sulfide layer, which is formed on the surface of the native sulfide layer. By such a combination of native sulfide growth and dielectric sulfide layer deposition in a continuous mode in which the vacuum in the reaction chamber is undisturbed and the substrate is not exposed to the atmosphere between successive process steps, recontamination of atmospherically sensitive prepared compound semiconductive surfaces may be prevented. In addition, by using neutral sulfur atoms to form the dielectric sulfide layer, the surface of the native sulfide can be maintained intact and damage thereto by charge or radiation bombardment can be avoided. The resulting device has optimized electrical properties at the interface of the substrate with the native sulfide/insulator composite. In particular, structures having these native sulfide layers and dielectric sulfide passivation layers may be used in the fabrication of HgCdTe photoconductive and photovoltaic devices, light-emitting diodes, and heterojunction lasers, and InSb infrared detectors. A typical structure might comprise, for example, a substrate of HgCdTe, a native sulfide layer having a thickness of 20 to 50 angstroms, and a dielectric zinc sulfide layer having a thickness of approximately 1000 angstroms.

EXAMPLE 1

This example illustrates the use of the process according to the first embodiment of the present invention as previously described herein.

Using the apparatus described and illustrated in relation to the FIGURE with two reactant gas chambers, a layer of ZnS was deposited on the surface of a wafer of silicon having a two-inch (5.08 centimeter) diameter. Carbonyl sulfide was used as the sulfur-containing precursor and dimethyl zinc, $Zn(CH_3)_2$, was the selected vapor phase reactant. A nitrogen carrier gas was used to carry the organometallic zinc compound, which has a low vapor pressure, into the reaction chamber 10. The reaction chamber 10 was evacuated by the vacuum-producing means to a pressure of $10^{-3}$ torr (mm. of mercury), then back-filled with nitrogen, and again evacuated to a pressure of $10^{-3}$ torr (mm. of mercury) in order to purge the system of residual air and water vapor. The flowmeters 30 and 32 were activated to admit the reactant gases in a predetermined ratio into the tube 34 and subsequently into the chamber 36 and the reaction chamber 10, and the reactant gas flow rates were stabilized. The operating pressure within the reaction chamber 10 was adjusted by means of the valve 24 to achieve a pressure of approximately 1 torr (mm. of mercury). The heating elements 21 and the cooling means 25 were activated. Finally, the low pressure mercury arc resonance lamps were activated and emitted radiation at 2537 Å, which was absorbed by the mercury vapor in the reaction chamber, producing photo-excited mercury atoms, which collided with the carbonyl sulfide to form atomic sulfur. The atomic sulfur then reacted with the $Zn(CH_3)_2$ to form ZnS, which deposited as a layer on the surface of the substrate.

When using a continuous flow photochemical reactor system at an operating pressure of 2 torr (mm. of mercury), with reactant gas flow rates of 2 standard cubic centimeters per minute (sccm) of $Zn(CH_3)_2$, 150 sccm of nitrogen, and 30 sccm of COS, films of ZnS were deposited at a rate of approximately 1360 angstroms per hour, to thicknesses of up to approximately 1100 angstroms. The ZnS films were found to be specular and durable, (i.e., scratch-resistant) and strongly adherent to the substrate (i.e., passed the known "tape test" for adhesion). In addition, this ZnS film had excellent morphology, being dense, non-granular and smooth. The refractive index of this material was determined by ellipsometry to be within the range of 2.1 to 2.3, which is characteristic of ZnS. The chemical composition of the zinc sulfide films formed by the above-described process of the present invention was determined by electron spectroscopy for chemical analysis (ESCA) and indicated excellent stoichiometry, i.e., $Zn:S=1.0$, with minimum oxygen contamination. Films of ZnS are known to be optically transmissive to radiation in the range of 2 to 12 micrometers, which makes ZnS films particularly useful as a passivation or optical coating layer for infrared detectors, which are active in the far infrared region.

Moreover, using the above-described process, a film of ZnS has been deposited on each of the following substrate materials: HgCdTe, InSb, GaAs, glass, and quartz. The quality of ZnS film produced on each substrate was substantially the same as that described above.

EXAMPLE 2

In accordance with an alternative embodiment of the present invention, a layer of ZnS was deposited on the surface of a silicon substrate using the procedure described in Example 1, except that the sulfur-containing precursor was hydrogen sulfide ($H_2S$). The quality of the ZnS film produced was substantially the same as that described in Example 1.

EXAMPLE 3

In accordance with the fifth process embodiment of the present invention as previously described herein, a native sulfide layer was formed on the surface of a HgCdTe substrate. The sulfur-containing precursor was carbonyl sulfide (COS), which was directly dissociated with 1849 Å radiation to form atomic sulfur. Using ESCA and based on the chemical shifts of the sulfur peaks, it was determined that 24 percent of the sulfur was present in the form of $SiO_4^{-2}$ and 76 percent was present as elemental sulfur or sulfide ($S^{-2}$).

In addition, using the above-described process, a native sulfide layer was formed on the surface of a silicon substrate.

While the present invention has been particularly described with respect to the preferred embodiments thereof, it will be recognized by those skilled in the art that certain modifications in form and detail may be made without departing from the spirit and scope of the invention. In particular, the scope of the invention is not limited to the photochemical vapor deposition of zinc sulfide, which was used merely as an example, but is intended to include the photochemical vapor deposition of any chosen sulfide compound from a selected vapor phase reactant that is capable of reacting with atomic sulfur to form a sulfide compound. In addition, the chemically unreactive sulfur-containing precursor is not limited to carbonyl sulfide, but is intended to include any material which will photochemically dissociate in the gas phase to produce atomic sulfur, either with or without mercury sensitization. Further, the scope of the present invention is not limited to the use of mercury as the photosensitizing agent, but is intended to include other known photosensitizing and energy transfer agents, such as cadmium or zinc, and the use of the corresponding wavelength of the resonance line thereof to produce excitation of these photosensitizers. In addition, the process of the present invention is not limited to the specific operating conditions described herein, which were provided merely as examples. In particular, the operating pressure may have a value higher or lower than the pressure specifically described herein.

Moreover, the scope of the present invention is not limited to the photochemical generation of atomic sulfur, which was used merely as an example, but is intended to include the use of any neutral, charge-free atomic sulfur which is generated in a manner that avoids the formation of charged particles or radiation which may damage the substrate.

Further, the substrate on which sulfide deposition may be performed by the process of the present invention is not limited to a silicon wafer, which was used herein as an example, but may include other semiconductor substrate materials (such as GaAs, HgCdTe, or InSb), electro-optical elements or components (such as lenses or mirrors, formed of a glass or plastic), or plastic materials. In addition, the scope of the present invention is not limited to the formation of a native sulfide layer of mercury cadmium telluride, which was used merely as an example, but is intended to include the formation of native sulfide layers of binary and ternary compound semiconductor materials, such as GaAlAs, InGaAs, InSb, GaAs, and GaSb, as well as elemental semiconductor materials, such as Ge, and any substrate material capable of undergoing native sulfide growth by means of atomic sulfur. Moreover, the process of the present invention is not limited to films of deposited sulfides or native sulfides used for the purposes described herein, but includes the deposition or formation of layers, films, or patterns of sulfides for any purpose.

Finally, the process of the present invention is not limited to the particular apparatus described herein, which was used merely as an example, but is intended to include any apparatus suitable for conducting a photochemical reaction of the type described herein. The reaction chamber described herein may have any configuration in which at least a portion thereof is formed of quartz or other material which is transmissive to the selected wavelength of radiation and may comprise, for example, a hollow quartz tube. Further, the process of the present invention may be accomplished in an apparatus in which the source of selected radiation is contained within the reaction chamber and a transmissive window is not needed.

What is claimed is:

1. A process for depositing a sulfide layer of a chosen element on the surface of a selected substrate which comprises: exposing said surface to a selected vapor phase reactant containing said element in the presence of neutral, charge-free sulfur atoms to produce a chemical reaction between said sulfur atoms and said reactant in a manner sufficient to form said sulfide layer on said surface of said substrate.

2. The process set forth in claim 1 wherein said neutral, charge-free sulfur atoms are formed by the mercury photosensitized dissociation of a chosen chemically unreactive sulfur-containing precursor.

3. The process set forth in claim 1 wherein said neutral, charge-free sulfur atoms are formed by exposing a chosen chemically unreactive sulfur-containing precursor to radiation of a selected wavelength to cause the direct dissociation of said precursor to form said sulfur atoms.

4. The process set forth in claim 2 or 3 wherein said chemically unreactive sulfur-containing precursor is selected from the group consisting of carbonyl sulfide, hydrogen sulfide, dialkyl sulfide, carbon disulfide, and methyl mercaptan.

5. The process set forth in claim 2 wherein:
   (a) said vapor phase reactant is dimethyl zinc;
   (b) said sulfur-containing precursor is carbonyl sulfide; and
   (c) said sulfide is zinc sulfide (ZnS).

6. The process set forth in claim 1 wherein said vapor phase reactant contains an element selected from the group consisting of zinc, indium, arsenic, lead, and cadmium.

7. The process set forth in claim 1 wherein said selected vapor phase reactant is chosen from the group consisting of dimethyl zinc, tetramethyl lead, arsine, trimethyl indium, and dimethyl cadmium.

8. The process set forth in claim 1 wherein the temperature of said reacting is sufficiently low so as to avoid thermal damage to said substrate.

9. The process set forth in claim 8 wherein said reacting occurs at a temperature in the range of about 30° C. to 300° C.

10. The process set forth in claim 1 wherein said exposing further includes being performed in the presence of a chosen dopant-containing material and said sulfide layer incorporates atoms of said dopant.

11. The process set forth in claim 1 wherein said substrate is selected from the group consisting of a semiconductor material, a glass material, and a plastic material.

12. The process set forth in claim 11 wherein said substrate has formed on the surface thereof a layer of a second chosen material, and said sulfide layer is formed on the surface of said second chosen material.

13. The process set forth in claim 1 wherein said layer is formed to a thickness within the range of 500 to 5000 angstroms.

14. A process for depositing a sulfide layer of a chosen element on the surface of a selected substrate comprising exposing said surface to a chosen vapor phase reactant containing said element and a chosen sulfur-containing precursor in the presence of radiation of a selected wavelength in a manner sufficient to bring about a chemical reaction to form said sulfide layer on said substrate.

15. The process set forth in claim 14 wherein said exposing further includes the presence of a chosen photosensitizing agent.

16. A low-temperature, charge-free process for depositing a layer of sulfide of a chosen element on the surface of a selected substrate while simultaneously avoiding damage to said substrate comprising exposing said substrate to a selected vapor phase reactant containing said element in the presence of neutral, charge-free sulfur atoms formed in a manner which avoids the generation of charged particles or high energy radiation, to bring about the reaction of said sulfur atoms with said vapor phase reactant to form said sulfide which deposits as said layer on said substrate, while simultaneously avoiding said damage to said substrate due to said charged particles or said high energy radiation.

17. A process for forming a layer of a native sulfide of a chosen material on the surface of a substrate of said chosen material comprising exposing said surface of said substrate to neutral, charge-free sulfur atoms to bring about a reaction between said sulfur atoms and said surface of said substrate to form said native sulfide.

18. The process set forth in claim 17 wherein said neutral, charge-free sulfur atoms are formed by exposing a chosen chemically unreactive sulfur-containing precursor to radiation of a selected wavelength to cause the direct dissociation of said precursor to form said sulfur atoms.

19. The process set forth in claim 17 wherein said neutral, charge-free sulfur atoms are formed by the mercury photosensitized dissociation of a chosen chemically unreactive sulfur-containing precursor.

20. The process set forth in claim 18 or 19 wherein said chemically unreactive sulfur-containing precursor is selected from the group consisting of: carbonyl sulfide, hydrogen sulfide, dialkyl sulfide, carbon disulfide, and methyl mercaptan.

21. The process set forth in claim 17 wherein said chosen material is selected from the group consisting of mercury cadmium telluride, gallium arsenide, and indium antimonide.

22. The process set forth in claim 17 wherein the temperature of said reaction is sufficiently low so as to avoid thermal damage to said substrate.

23. The process set forth in claim 18 wherein:
   (a) said chosen material is mercury cadmium telluride;
   (b) said chosen sulfur-containing precursor is carbonyl sulfide; and
   (c) said native sulfide comprises (mercury, cadmium) sulfide and tellurium sulfide.

24. A process for forming a native sulfide on a substrate of a chosen semiconductor material which comprises:
 (a) providing a selected sulfur-containing precursor;
 (b) irradiating said precursor with radiation of a predetermined wavelength and sufficient to dissociate neutral sulfur atoms therefrom; and then
 (c) reacting said sulfur atoms with said substrate to form said native sulfide.

25. A process for forming a layer of a native sulfide of a chosen material on the surface of a substrate of said chosen material comprising exposing said surface of said substrate to a chosen sulfur-containing precursor in the presence of radiation of a selected wavelength in a manner sufficient to bring about a chemical reaction to form said native sulfide layer on said substrate.

26. A process for forming a semiconductor device having optimized electrical interface properties, comprising the steps of:
 (a) providing a substrate of a chosen semiconductor material;
 (b) generating neutral sulfur atoms;
 (c) exposing said substrate to said neutral sulfur atoms to cause a reaction between said neutral sulfur atoms and the surface of said substrate to form a first layer of a native sulfide of said chosen semiconductor material, said native sulfide being formed in a manner which eliminates damage to said substrate due to exposure to charged species or high energy radiation; and
 (d) forming a second layer of a chosen dielectric passivation material on the surface of said first layer of said native sulfide, to form a native sulfide/insulator composite, whereby the interface of said substrate with said native sulfide/insulator composite has said optimized electrical interface properties.

* * * * *